United States Patent [19]
Razavi

[11] Patent Number: 5,534,802
[45] Date of Patent: Jul. 9, 1996

[54] SAMPLE AND HOLD CIRCUITRY IN BIPOLAR TRANSISTOR TECHNOLOGY USING A BOOTSTRAPPING TECHNIQUE

[75] Inventor: Behzad Razavi, Aberdeen, N.J.

[73] Assignee: AT&T Corp., Murray Hill, N.J.

[21] Appl. No.: 299,724

[22] Filed: Sep. 1, 1994

[51] Int. Cl.$^6$ ............................................. G11C 27/02
[52] U.S. Cl. ........................................ 327/94; 327/96
[58] Field of Search ............................. 327/91, 94, 96, 327/202, 561, 563, 93, 390, 589

[56] References Cited

U.S. PATENT DOCUMENTS

| | | | |
|---|---|---|---|
| 4,400,637 | 8/1983 | Klar et al. | 327/91 |
| 4,560,888 | 12/1985 | Oida | 327/202 |
| 4,694,341 | 9/1987 | Soneda et al. | 327/91 |
| 4,873,457 | 10/1989 | Sanielevici | 327/94 |
| 5,298,801 | 3/1994 | Vorenkamp et al. | 327/91 |
| 5,399,912 | 3/1995 | Murata et al. | 327/94 |

OTHER PUBLICATIONS

Pieter Vorenkamp et al., "Bipolar, 120-Msample/s 10-b Track-and-Hold Circuit," *IEEE Journal of Solid-State Circuits*, vol. 27, No. 7, Jul. 1992, pp. 988-992.

Primary Examiner—Timothy P. Callahan
Assistant Examiner—My-Trang Ton
Attorney, Agent, or Firm—D. I. Caplan; B. S. Schneider

[57] ABSTRACT

A sample-and-hold circuit is formed in bipolar transistor technology with the aid of clocked and complementary-clocked bipolar transistors in combination with a holding capacitor whose output terminal, in going from sample to hold phases of the clock, undergoes change in voltage $\Delta V$ equal to the input voltage samples Vin applied to its input terminal during the sample phases (electrical bootstrapping operation). In particular, an input terminal of the holding capacitor is connected to a clocked input voltage device that ensures that, during the sample phases, the input voltage applied to the input terminal of the capacitor represents the input voltage being sampled, and that during the hold phases of the clock, the input terminal of the capacitor is electrically clamped. An output terminal of the holding capacitor is connected to one of the clocked transistors and to an auxiliary bipolar transistor whose base terminal is controlled by a complementary-clocked voltage-dropping device. This complementary-clocked voltage-dropping device sets the output terminal of the capacitor to a fixed voltage during the sample phases and is disconnected from this output terminal during the hold phases, whereby during the hold phases the output terminal of the holding capacitor is electrically floating and the voltage thereat represents the input voltage during the immediately preceding sample phase.

19 Claims, 1 Drawing Sheet

SAMPLE AND HOLD CIRCUITRY IN BIPOLAR TRANSISTOR TECHNOLOGY USING A BOOTSTRAPPING TECHNIQUE

FIELD OF THE INVENTION

This invention relates to integrated circuits and more particularly to sample-and-hold circuitry in bipolar transistor technology.

BACKGROUND OF THE INVENTION

Sample-and-hold (S-H) circuitry is useful as a component in such devices as analog signal filters and analog-to-digital (A/D) converters. Such devices entail overall circuitry designs having rather high accuracy—i.e., high circuitry linearity. For example, an A/D converter having an output accuracy of 10 bits (i.e., an output representing a binary digital number having 10 bit-places) requires an A/D conversion linearity of one part per $2^{10}$, that is to say, an accuracy of approximately one part per thousand. Such an accuracy translates into a distortion in the output amplitude equal to less than 60 dB. Hence the S-H circuitry contained in the A/D converter likewise must have less than 60 dB distortion. In other words, the S-H circuitry must have an accuracy of at least one part per thousand (i.e., an accuracy of at least 10 bits).

A paper by P. Vorenkamp and J. P. M. Verdaasdonk, "Fully Bipolar 120-Msample/s 10-b Track-and Hold Circuit," *IEEE J. Solid-State Circuits*, vol. SC-27, pp. 987–992 (July 1992), teaches S-H circuitry built in bipolar transistor technology with the following reported parameters to achieve an accuracy of 10-bits (at a 120 MHz sampling rate): a voltage supply of 5 V, a power dissipation of 40 mW, and a differential voltage swing of 1 V on a pair of balanced inputs and outputs (using a balanced, unity gain configuration). Because of the inherent base-emitter voltage drop of bipolar transistors (typically a drop of approximately 0.8 V in the ON state of such transistors), if such circuitry would be powered by a desirably lower voltage supply of 3.3 V, the circuitry could attain only an accuracy of only 6 bits. Therefore, it would be desirable to have S-H circuitry in bipolar transistor technology that can attain an accuracy of 10-bits with a voltage supply of only 3.3 V, preferably with a power dissipation lower than 40 mW, and with a larger balanced differential swing than 1 V (0.5 V single-ended).

SUMMARY OF THE INVENTION

Sample-and-hold circuitry is built in bipolar transistor technology with the aid, among other things, of clocked and complementary-clocked bipolar transistors in combination with a holding capacitor. As desired in output terminal, in going from sample to hold phases of the clock, an output terminal of this holding capacitor undergoes change in voltage ΔV equal to the input voltage samples Vin applied to its input terminal during the sample phases (electrical bootstrapping operation).

In particular, an input terminal of the holding capacitor is connected to a clocked input voltage device that ensures that, during the sample phases, the input voltage applied to the input terminal of the capacitor represents the input voltage being sampled, and that during hold phases of the clock, the input terminal of the capacitor is electrically clamped. An output terminal of the holding capacitor is connected to one of the clocked transistors and to an auxiliary bipolar transistor whose base terminal is controlled by a complementary-clocked voltage-dropping device. This complementary-clocked voltage-dropping device sets the output terminal of the capacitor to a fixed voltage during the sample phases and is disconnected from this output terminal during the hold phases, whereby during the hold phases the output terminal of the holding capacitor is electrically floating and the voltage thereat represents the input voltage during the immediately preceding sample phase.

In a specific embodiment this invention provides sample-and-hold circuitry in bipolar transistor technology comprising:

(a) first and second clock-controlled bipolar transistors;

(b) a first resistor connected in series with the first clock-controlled transistor, whereby a first node is formed between them and a first branch is formed by them;

(c) a third bipolar transistor having a base terminal connected to the first node and having a high-current-carrying terminal connected to a second node;

(d) a fourth bipolar transistor connected in series with the second transistor, whereby a third node is formed between them and a second branch is formed by them;

(e) a complementary-clocked voltage-dropping device, connected in parallel with the first and second branches, having a node connected to a base terminal of the fourth transistor;

(f) a capacitor having a first terminal connected to the second node and a second terminal connected to the third node; and (g) an input device connected to the second node.

As used herein, the term "high-current-carrying terminal" means, in the case of a terminal of a bipolar transistor, either a collector terminal or an emitter terminal of the transistor. Preferably, all transistors are built in an integrated circuit chip, as known in the art, so that they all have equal threshold voltages.

Advantageously the circuitry further comprises electrically conductive wiring for connecting another high-current-carrying terminal of the third transistor to a high-current-carrying terminal of the fourth transistor. Advantageously also, the circuitry further comprises a first current source having a terminal thereof connected in series with the complementary-clocked voltage-dropping device and with the first and second branches.

Advantageously further, the complementary-clocked voltage-dropping device comprises:

a dc voltage-dropping device;

a second resistor;

a complementary-clocked sixth bipolar transistor connected in series with both the dc voltage-dropping device and the second resistor, whereby a fourth node is formed between the sixth transistor and the dc voltage-dropping device, the fourth node being connected to the base terminal of the fourth transistor; and a second current source having a terminal thereof connected to the fourth node.

The input device of the circuitry advantageously comprises a fifth bipolar transistor having one of its high-current-carrying terminals connected to the third node and to a second current source.

Sample-and-hold circuitry in accordance with the invention has been successfully built and tested in bipolar transistor technology having a minimum emitter feature size of approximately 1.5 μm, whereby the circuitry achieved an accuracy of 10 bits (at a sampling rate of 100 MHz) with the following parameters (in a unity gain configuration): a power supply of 3.3 V, a differential input swing of approximately 3.0 V (1.5 V single-ended), and a resulting power dissipation of 10 mW.

DETAILED DESCRIPTION

Figure 1:
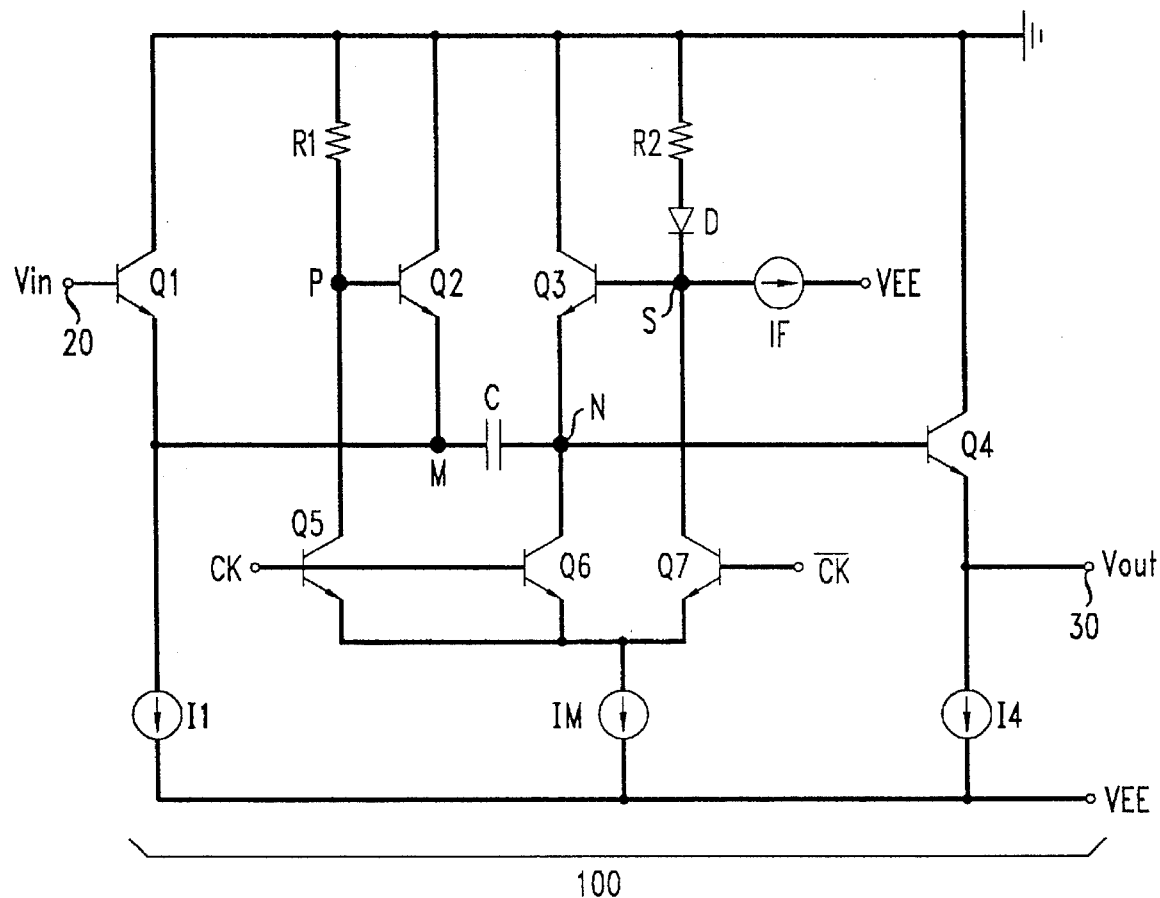
FIG. 1 is an electrical schematic of single-ended sample-and-hold integrated circuitry in bipolar transistor technology, in accordance with a specific embodiment of the invention.

As indicated in FIG. 1, single-ended S-H integrated circuitry 100 has an input voltage Vin and an output voltage Vout on respective input and output terminals 20 and 30. Clock pulses CK are applied to bipolar npn transistors Q5 and Q6, and complementary clock pulses $\overline{CK}$ are applied to a bipolar npn transistor Q7. As discussed in greater detail below, when CK is HIGH, a sample phase $\phi1$ is produced in the circuitry 100; when CK is LOW, a hold phase $\phi2$ is produced. Because of the unity gain configuration of the circuitry 100, in going from each sample phase to each immediately following hold phase, the change $\Delta$Vout of the output voltage Vout is equal to the input voltage Vin during the sample phase.

As further indicated in FIG. 1, a dc power supply voltage VEE, advantageously equal to approximately −3.3 V, is applied to one terminal of each of four current sources I1, IM, IF, and I4—advantageously all built in bipolar transistor technology. Illustratively, each of the current sources I1, IM and I4 supplies 0.5 mA, whereas the current source IF supplies 10 μA.

A ground is connected to collector terminals of each of four bipolar npn transistors Q1, Q2, Q3 and Q4, as well as to a terminal of each of resistors R1 and R2. Another terminal of each of the current sources I1 and I4 is separately respectively connected to an emitter terminal of the bipolar transistors Q1 and Q4; whereas another terminal of the current source IM is connected to each of the emitter terminals of bipolar transistors Q5, Q6 and Q7. On their collector sides, the transistors Q5, Q6, and Q7 act as three current sources controlled by a clock pulse source—as more fully explained below.

Advantageously the transistors Q5 and Q6 are a matched pair (i.e., have the same electrical characteristics, especially in their ON states). The resistor R1 typically is equal to approximately 8 kΩ, and R2 typically is equal to approximately 500 Ω.

The bipolar transistor Q5 is connected in series with the resistor R1, whereby a node P is formed between them. This node P is connected to a base terminal of the bipolar transistor Q2. A node M is separately connected to the emitter terminal of each of the bipolar transistors Q1 and Q2, as well as to one terminal of a holding capacitor C. Illustratively, the capacitance of this capacitor C is equal to approximately 0.5 pf. A node N is connected to another terminal of the capacitor C, as well as to an emitter terminal of the bipolar transistor Q3, a collector terminal of the bipolar transistor Q6, and a base terminal of an output bipolar transistor Q4. A collector terminal of the transistor Q4 is connected to the ground.

Another terminal of the resistor R2 is connected to a terminal of a diode D. A node S is connected separately to each of the following: (1) a base terminal of the bipolar transistor Q3, (2) a collector terminal of the bipolar transistor Q7, and (3) another terminal of the current source IF. Illustratively, since this current source IF delivers an electrical current that is equal to approximately 10 μA, the voltage drop across the resistor R2 is equal to approximately 10 μA×500 Ω=5 mV, which is negligible compared to the voltage drop (typically 0.8 V =800 mV) across the diode D.

A clock pulse source CK is connected to a base terminal of each of the bipolar transistors Q5 and Q6, and a complementary clock pulse source $\overline{CK}$ is connected to a base terminal of the bipolar transistor Q7.

Figure 2:
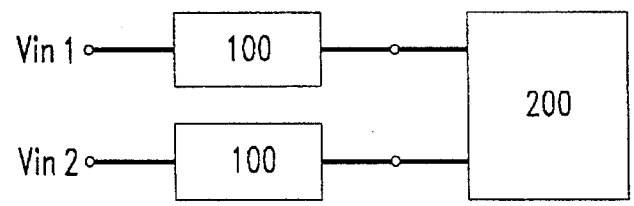
FIG. 2 is a block diagram of balanced sample-and-hold integrated circuitry, in accordance with another specific embodiment of the invention.

For balanced S-H circuitry, as indicated in FIG. 2, each of a matched pair of the single-ended S-H circuitry 100, each in accordance with FIG. 1, has a separate input terminal 20. Each of balanced differential input voltages Vin1 and Vin2 (Vin1=−Vin2) is applied to a separate one of these input terminals 20. Also, each of a pair of the single-ended S-H circuitry 100 has its output terminal connected to a utilization device 200.

During electrical operations, as mentioned above, there are two phases of the clock CK during each period thereof: (1) a sample phase $\phi1$, during which CK is HIGH and turns ON any transistor (in FIG. 1) to whose base terminal it is applied, and (2) an immediately following hold phase $\phi2$, during which CK is LOW and turns OFF any transistor (in FIG. 1) to whose base terminal it is applied (because all transistors shown in FIG. 1 are npn transistors). Conversely, during the phase $\phi1$ the complementary clock $\overline{CK}$ turns OFF any transistor in FIG. 1 to whose base terminal it is applied, and during the phase $\phi2$ the complementary clock $\overline{CK}$ turns ON any transistor to whose base terminal it is applied. Advantageously the input voltage Vin is an analogue input voltage that varies illustratively between approximately −0.2 V (Vin =Vin(MAX)) and approximately −1.7 V (Vin= V(MIN)). The transistor Q4 operates as an output buffer transistor and is not essential to the discussion of the operation of the circuitry 100.

OPERATIONS DURING $\phi1$, WHEN CLOCK CK IS HIGH (SAMPLE PHASE)

During phase $\phi1$ (when CK is HIGH) the (matched) transistors Q5 and Q6 are both ON and the transistor Q7 is OFF ($\overline{CK}$ is LOW). At the same time, the voltage applied to the base of the transistor Q3 will be such that Q3 will be ON, as can be seen from the following considerations.

The current source IF acts to maintain the diode D in its ON state. 0n the other hand, the magnitude of IF (illustratively 10 μA) is such that the voltage drop across the resistor R2 (illustratively approximately 10 μA×500 Ω=5 mV) is negligible compared with the voltage drop (typically approximately 0.8 V) across the diode D itself. Thus the voltage VS at the node S will be approximately a diode drop below ground, that is, VS=−0.8 V, approximately.

The voltage level delivered by the HIGH clock pulses CK is made sufficient to put Q6 (as well as Q5) in its forward active region; therefore, Q5 (as well as Q6) is ON and acts as a current source on its collector side. Thus, when the clock CK is HIGH, the transistor Q3 is then ON because its base terminal is connected to VEE and its collector-emitter current path is connected in series with Q6 (which is then ON). Therefore the voltage VN at the node N will be equal to the diode drop across D plus the base-emitter drop across Q3 in its ON state—which will serve to clamp the voltage VN of node N at VN=−0.8 V−0.8 V=−1.6 V, approximately.

At the same time, both Q5 and Q6 are ON with equal base-emitter voltages; therefore, since Q5 and Q6 are matched and are operating in their forward active region, each acts as a current source of one-half IM=IM/2. Illustratively, since IM is equal to approximately 0.5 mA, the voltage VP at the node P is equal to approximately −0.25 mA×8 kΩ=−2 V.

As to the voltage VM at the node M: since Q1 is ON, VM is equal to (Vin−0.8 V). Thus illustratively: when Vin is equal to Vin (MIN) (=−1.7 V), VM is equal to approximately −1.7 V−0.8 V=−2.5 V; when Vin is equal to Vin(MAX) (=−0.2 V), VM is equal to approximately −0.2 V−0.8 V=−1.0 V.

Illustratively, therefore, since VP=−2.0 V, even when Vin is equal to Vin(MIN) (i.e., Vin=−1.7 V), then the base emitter-voltage applied to Q2 will be equal to approximately only −2.0 V−2.5 V=+0.5 V, whereas an applied base-emitter voltage of at least +0.8 V is required to turn ON the transistor Q2. Consequently, the path from the node M through the transistor Q2 to ground is open, as is desired. This open path will thus be attained if the positive (absolute) magnitude of the IR drop across R1 is equal to or greater than the sum of approximately 0.3 V plus the positive magnitude of Vin-(MIN). When Vin is equal to Vin(MAX), then Q2 is more strongly OFF, as is desirable to enable Vin to control the voltage VM at the node M during the sample phase.

OPERATIONS DURING φ2, WHEN CLOCK CK IS LOW (HOLD PHASE)

During this phase φ2, the transistors Q5 and Q6 are OFF, whereas transistor Q7 is ON. In particular, therefore, because Q6 is OFF the node N is floating, whereas the voltage VP at the node P is at ground (i.e., 0 V). Thus the transistor Q2 is ON regardless of the value of Vin. The transistor Q1 is OFF so long as the voltage Vin is selected (in particular, its MAX value) that Vin remains at least approximately 0.2 V below VP (=0 V) during the hold phase. With this selection of Vin, the voltage VM at the node M is therefore equal to approximately −0.8 V (i.e., the voltage at the node P less the base-emitter voltage of Q2)

As to the transistor Q3, it is OFF, if for no other reason than that the transistor Q6 is OFF. But there is an additional factor that further guarantees that Q3 is OFF even if Vin was MAX during the sample phase, as can be seen from the following considerations.

Since Q7 is ON during the hold phase while both Q5 and Q6 are OFF, the current IM flows not only through Q7 but also through both the diode D and the resistor R2 (except for a negligible amount of current IF). Hence a voltage equal to approximately −IM×R2−0.8 V is applied to the base terminal of Q3. Consequently the base-emitter voltage of Q3 is equal to approximately:

(−IM×R2−0.8V)−(Vin−1.6V)=Vin+0.8V−IM×R2.

Illustratively, if and when Vin was equal to Vin (MAX) during the sample phase, (i.e., Vin=−0.2 V) and in any case IM×R2=0.5 mA×500 Ω=0.25 V., then during the hold phase the base-emitter voltage of Q3 is equal to approximately −0.2 V+0.8 V−0.25 V=−0.35 V. This base-emitter voltage of −0.35 V is negative and hence is more than sufficient to guarantee that the transistor Q3 is strongly OFF, since a base-emitter voltage of at least +0.5 V is required for this transistor Q3 to be even weakly ON.

Going from the sample to the hold phase, the voltage VS at node S, which is equal to the voltage applied to the base terminal of the transistor Q3, has thus changed by ΔVS=−1.05 V−0.8 V=−0.25 V, approximately. More generally, this change ΔVS in VS is equal to approximately −IM×R2.

The current source IF in combination with the resistor R2, the diode D, the transistor Q7, and the current source IF thus cooperated as a complementary-clocked voltage-dropping device to ensure that Q3 was ON during the sample phase and that Q3 is OFF during the hold phase.

Thus, at any rate, in going from the sample to the hold phase, the voltage VM on the node M has undergone a change ΔVM that is equal to approximately −0.8 V−(Vin−0.8 V)=−Vin. Because the node N is floating and is connected to the node M only through the capacitor C, the node N undergoes a voltage change equal to the voltage change undergone by the node M: that is, ΔVN=ΔVM=−Vin, approximately. (This change ΔVN in the voltage on the node N constitutes an example of the well-known phenomenon called "bootstrapping".) This change ΔVN=Vin occurs regardless of the value of Vin during the hold phase (during which the ON state of Q2 controls over the state of Q1)—as is desired in any sample-and-hold circuitry. At any rate the voltage on the node N during the hold phase is thus equal to −1.6 V+ΔVN=−Vin−1.6 V, approximately, where Vin was the input voltage during the sample phase, regardless of the value of Vin during the hold phase. Thus the voltage VN at the node N during the hold phase represents a desired output of sample-and-hold circuitry, and this output is applied to the base terminal of the output transistor Q4.

OPERATION OF OUTPUT TRANSISTOR Q4

Turning to the output transistor Q4, during the sample phase, the voltage VN at the base terminal of this output transistor Q4 was equal to approximately −1.6 V. Consequently the output transistor Q4 was ON. Hence the voltage Vout at the output terminal of the circuitry 100, which is equal to the voltage at the emitter terminal of Q4, was equal to approximately −1.6 V−0.8 V=−2.4 V (because of the 0.8 V base-emitter drop across Q4).

During the hold phase, the voltage VN at the node N is equal to approximately −Vin−1.6 V. Hence the output transistor Q4 is again ON, whereby the voltage Vout at the output terminal of the circuitry 100 is equal to approximately −Vin−1.6 V−0.8 V=−Vin−2.4 V. Thus in going from the sample to the hold phase, the change ΔVout in the voltage at the output terminal will be equal to approximately −Vin−2.4 V−2.4 V =−Vin (unity gain), where Vin is the input voltage during the sample phase. On the other hand, this change ΔVout is independent of the value of the input voltage during the hold phase, as was the change ΔVN in the voltage at the node N—as is desired in any sample-and-hold circuitry.

Although the invention has been described in detail in terms of specific embodiment, various modifications can be made without departing from the scope of the invention. For example, instead of a negative polarity for VEE, the ground and VEE can be interchanged. Instead of being connected to ground, the collector terminal of the transistor Q2 can be connected to another voltage supply. Instead of npn bipolar transistors, pnp bipolar transistors can be use in conjunction with reversals in the directions of the current sources, a reversal in the direction of the diode D, and suitable changes in the values of Vin (depending on the threshold voltages of the pnp transistors) as well as in the polarity of VEE. Also, the output transistor Q4 can be omitted from the circuitry 100 and the output of the remaining (sample-and-hold) circuitry then taken from the node N. Moreover, the positions of the diode D and the resistor R2 can be interchanged. The combination of $Q5_1$, Q6, Q7, and IM can be replaced with three independent clocked current sources connected to the nodes P, N, and S, respectively. Finally, instead of the diode D, a dc voltage source, illustratively of approximately 0.8 V, can be used.

I claim:

1. Circuitry comprising:
   (a) first and second clock-controlled bipolar transistors;
   (b) a first resistor connected to a reference supply voltage and in series with the first clock-controlled transistor, whereby a first node is formed between them and a first branch is formed by them;
   (c) a third bipolar transistor having a base terminal connected to the first node and having a high-current-carrying terminal connected to connected between said reference supply voltage and a second node;
   (d) a fourth bipolar transistor connected to said reference supply voltage and in series with the second clocked-controlled transistor, whereby a third node is formed between them and a second branch is formed by them;
   (e) a complementary-clocked voltage-dropping device, connected in parallel with the first and second branches, having a fourth node connected to a low-current-carrying terminal of the fourth transistor;
   (f) a capacitor having a first terminal connected to the second node and a second terminal connected to the third node whereby the capacitor supplies bootstrapping; and
   (g) an input device connected to the second node.

2. The circuitry of claim 1 further comprising electrically conductive wiring for connecting another high-current-carrying terminal of the third transistor to a high-current-carrying terminal of the fourth transistor.

3. The circuitry of claim 2 further comprising a first current source having a terminal thereof connected in series with the complementary-clocked voltage-dropping device and with the first and second branches.

4. The circuitry of claim 3 in which the complementary-clocked voltage-dropping device comprises:
   a dc voltage-dropping device;
   a second resistor;
   a complementary-clocked fifth bipolar transistor connected in series with both the dc voltage-dropping device and the second resistor, whereby the fourth node is formed between the fifth transistor and the dc voltage-dropping device, the fourth node being connected to the low-current-carrying terminal of the fourth transistor; and
   a second current source having a terminal thereof connected to the fourth node.

5. The circuitry of claim 4 further comprising a dc voltage source connected in series with the first current source and the first branch.

6. The circuitry recited in claim 2 in which the input device comprises a sixth bipolar transistor having one of its high-current-carrying terminals connected to the second node and to a third current source.

7. The circuitry of claim 2 further comprising:
   an output terminal of the circuitry; and
   a seventh bipolar transistor having a base terminal connected to the third node and having a high-current carrying terminal connected to the output terminal of the circuitry and to a fourth current source.

8. The circuitry of claim 2 further comprising a dc voltage source connected in series with the first current source and the first branch.

9. The circuitry of claim 1 further comprising a first current source having a terminal thereof connected in series with the complementary-clocked voltage-dropping device and with the first and second branches.

10. The circuitry of claim 9 in which the complementary-clocked voltage-dropping device comprises:
    a dc voltage-dropping device;
    a second resistor;
    a complementary-clocked fifth bipolar transistor connected in series with both the dc voltage-dropping device and the second resistor, whereby the fourth node is formed between the fifth transistor and the dc voltage-dropping device, the fourth node being connected to the low-current-carrying terminal of the fourth transistor; and
    a second current source having a terminal thereof connected to the fourth node.

11. The circuitry recited in claim 10 in which the input device comprises a sixth bipolar transistor having one of its high-current-carrying terminals connected to the second node and to a third current source.

12. The circuitry of claim 10 further comprising a dc voltage source connected in series with the third current source and the first branch.

13. The circuitry recited in claim 9 in which the input device comprises a sixth bipolar transistor having one of its high-current-carrying terminals connected to the second node and to a third current source.

14. The circuitry of claim 9 further comprising a dc voltage source connected in series with the first current source and the first branch.

15. The circuitry of claim 1 in which the complementary-clocked voltage-dropping device comprises:
    a dc voltage-dropping device;
    a second resistor;
    a complementary-clocked fifth bipolar transistor connected in series with both the dc voltage-dropping device and the second resistor, whereby the fourth node is formed between the fifth transistor and the dc voltage-dropping device, the fourth node being connected to the low-current-carrying terminal of the fourth transistor; and
    a second current source having a terminal thereof connected to the fourth node.

16. The circuitry of claim 15 further comprising electrically conductive wiring for connecting another high-current-carrying terminal of the third transistor to a high-current-carrying terminal of the fourth transistor.

17. The circuitry recited in claim 15 in which the input device comprises a sixth bipolar transistor having one of its high-current-carrying terminals connected to the second node and to a third current source.

18. The circuitry of claim 15 further comprising:
    an output terminal of the circuitry; and
    a seventh bipolar transistor having a base terminal connected to the third node and having a high-current carrying terminal connected to the output terminal of the circuitry and to a fourth current source.

19. The circuitry of claim 15 further comprising a dc voltage source connected in series with the first current source and the first branch.

* * * * *

UNITED STATES PATENT AND TRADEMARK OFFICE
CERTIFICATE OF CORRECTION

PATENT NO. : 5,534,802
DATED : July 9, 1996
INVENTOR(S) : Behzad Razavi

It is certified that error appears in the above-indentified patent and that said Letters Patent is hereby corrected as shown below:

Column 7, line 17, "connected to connected between" should read --connected between--.

Signed and Sealed this

Eleventh Day of February, 1997

Attest:

BRUCE LEHMAN

Attesting Officer    Commissioner of Patents and Trademarks